(12) United States Patent
Vodanovic et al.

(10) Patent No.: US 8,695,990 B2
(45) Date of Patent: Apr. 15, 2014

(54) WAFER FLATTENING APPARATUS AND METHOD

(75) Inventors: Bojko Vodanovic, Baie d'Urfé (CA); Jakov Kogan, Montreal (CA); Marc Lévesque, St-Laurent (CA); Alexandr Filenkov, Pierrefonds (CA)

(73) Assignee: Nidec-Read Corporation, Ukyo-Ku, Kyoto (JP)

(*) Notice: Subject to any disclaimer, the term of this patent is extended or adjusted under 35 U.S.C. 154(b) by 424 days.

(21) Appl. No.: 13/078,391

(22) Filed: Apr. 1, 2011

(65) Prior Publication Data

US 2011/0241298 A1    Oct. 6, 2011

Related U.S. Application Data

(60) Provisional application No. 61/320,001, filed on Apr. 1, 2010.

(51) Int. Cl.
*B23B 31/30* (2006.01)

(52) U.S. Cl.
USPC .................................................. 279/3

(58) Field of Classification Search
USPC ................... 29/559, 743; 279/3; 414/931
See application file for complete search history.

(56) References Cited

U.S. PATENT DOCUMENTS

| | | | |
|---|---|---|---|
| 6,126,382 A | 10/2000 | Scales et al. | |
| 7,104,579 B2* | 9/2006 | Casarotti et al. | 294/185 |
| 8,089,615 B2* | 1/2012 | Mizutani et al. | 355/73 |
| 2002/0160693 A1 | 10/2002 | Nihonmatsu et al. | |
| 2007/0267145 A1 | 11/2007 | Hiroho et al. | |
| 2009/0093192 A1 | 4/2009 | Tamami et al. | |
| 2010/0013169 A1 | 1/2010 | Monteen et al. | |

* cited by examiner

*Primary Examiner* — John C Hong
(74) *Attorney, Agent, or Firm* — Brooks Kushman P.C.

(57) ABSTRACT

An apparatus and method for securing a substantially circular wafer uses a chuck having a plurality of tensioning grooves each having at least one arcuate bend having a bend radius substantially less than an outer region radius, and a vacuum source interconnected with each of the grooves. When the wafer is placed upon the surface concentric with the chuck center and the vacuum source applied to the grooves, the wafer is held securely to the surface without distortion.

19 Claims, 19 Drawing Sheets

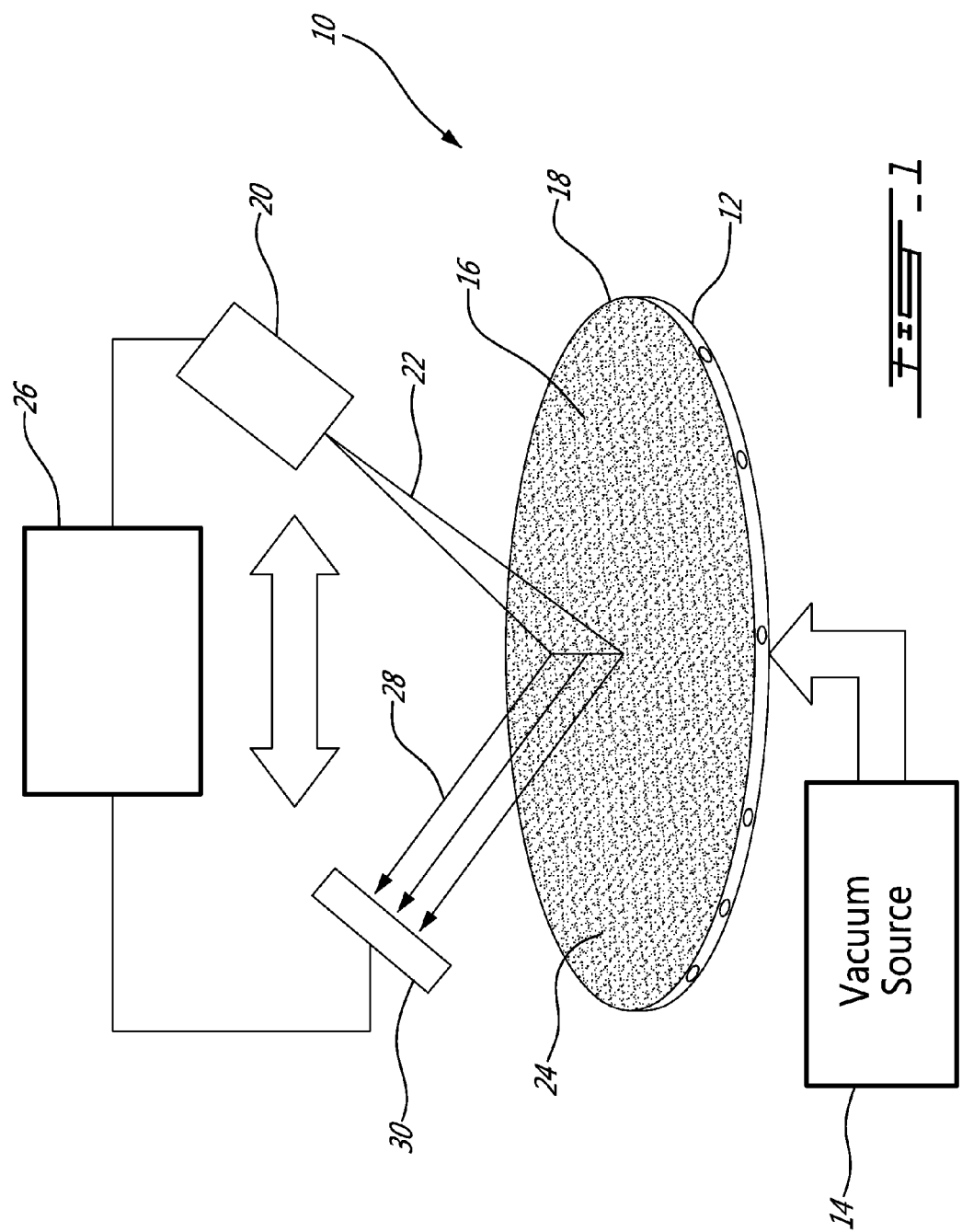

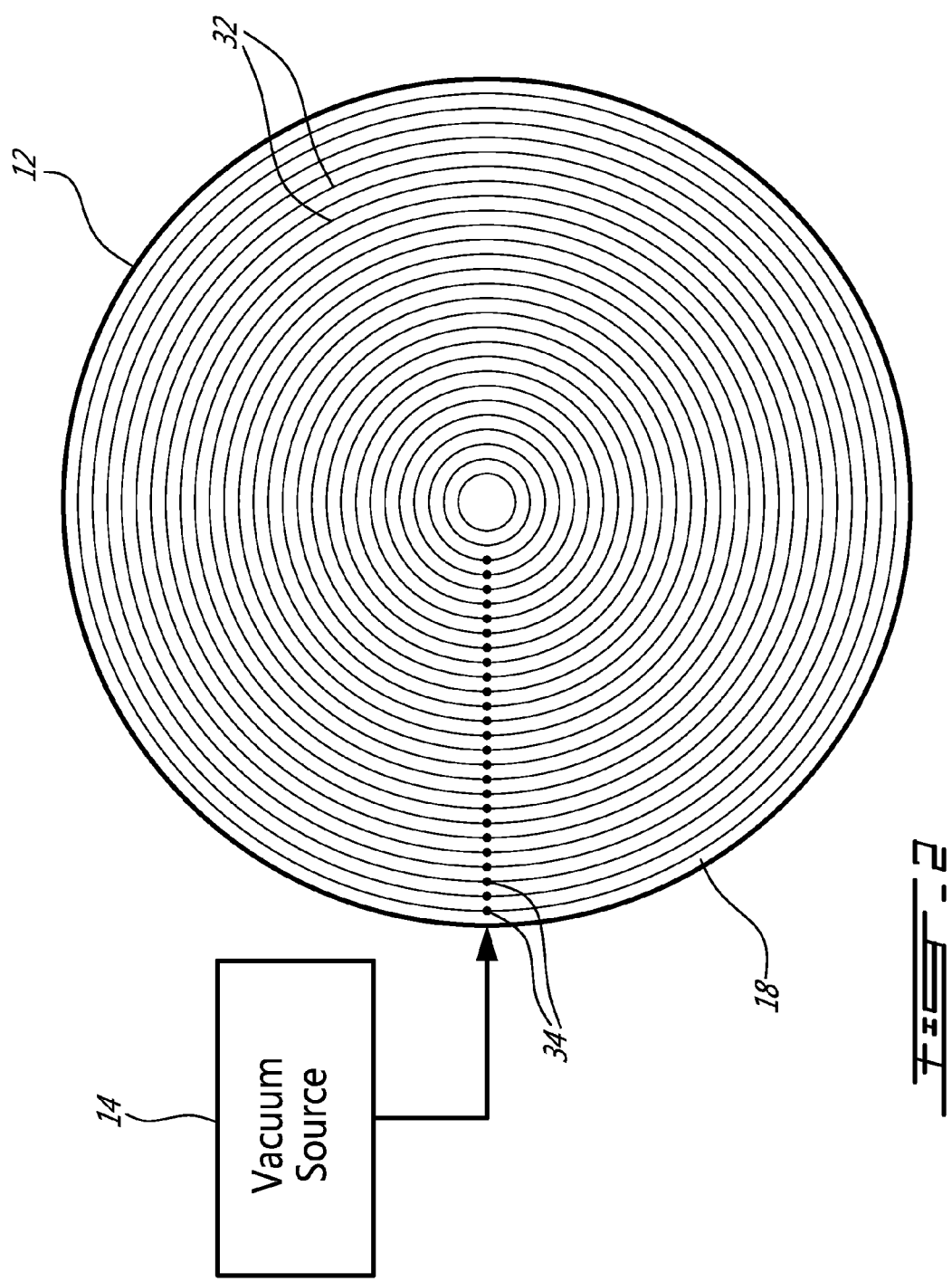

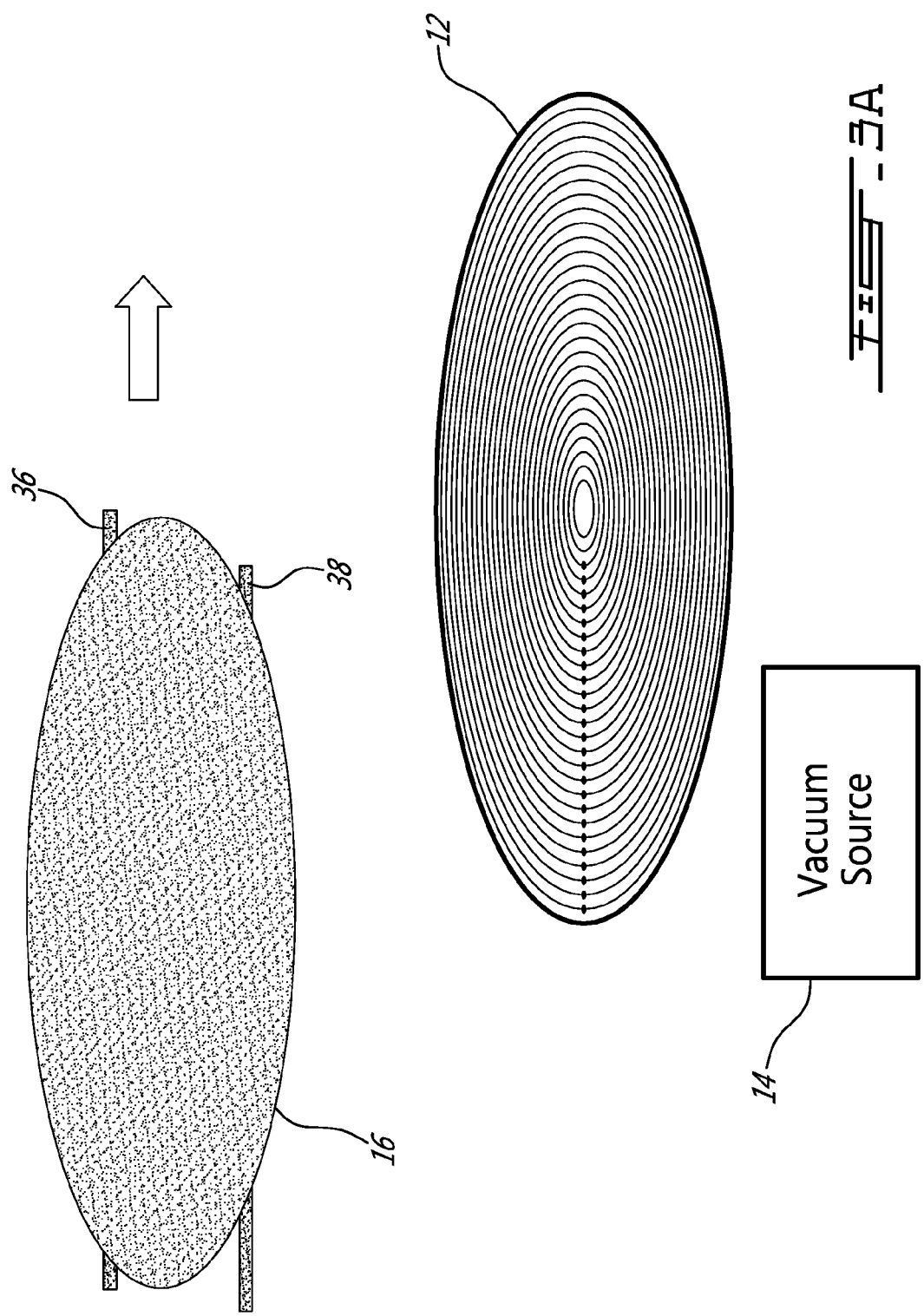

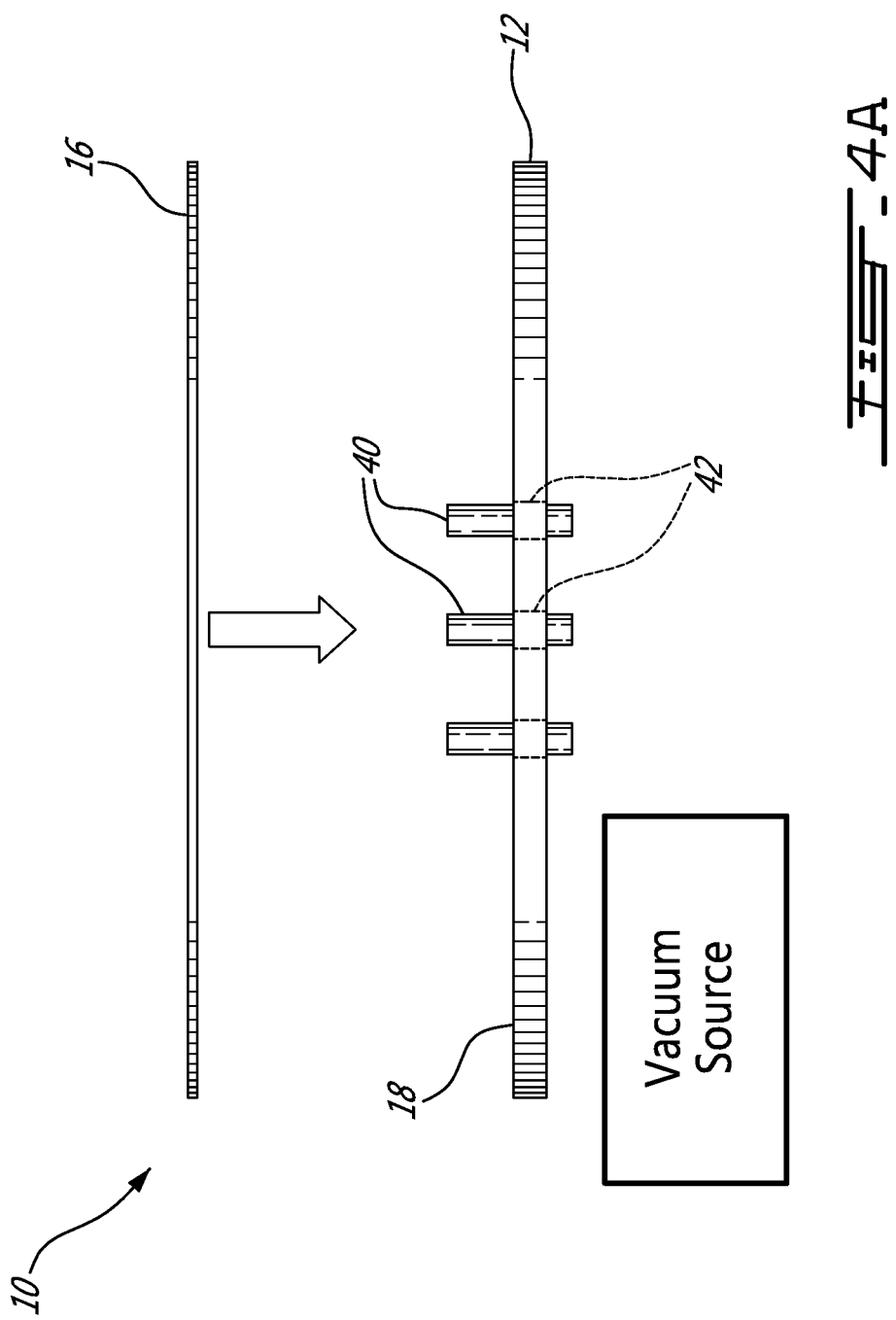

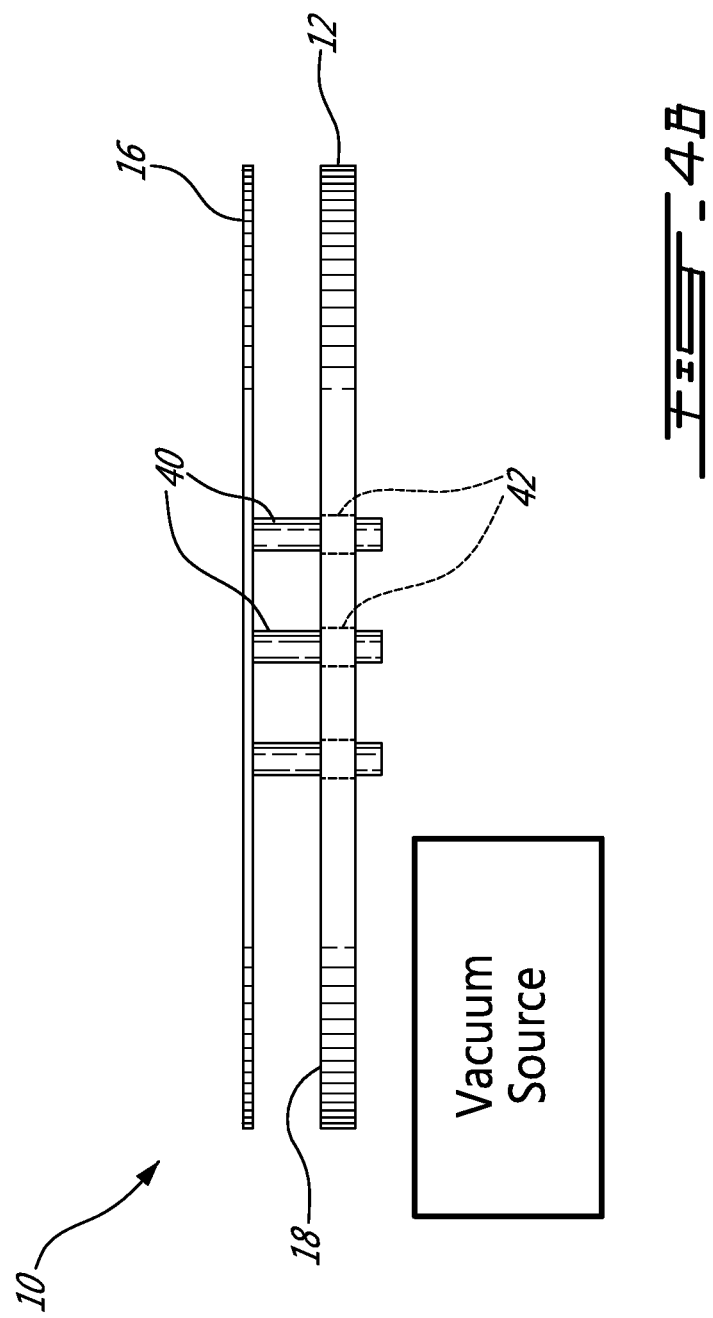

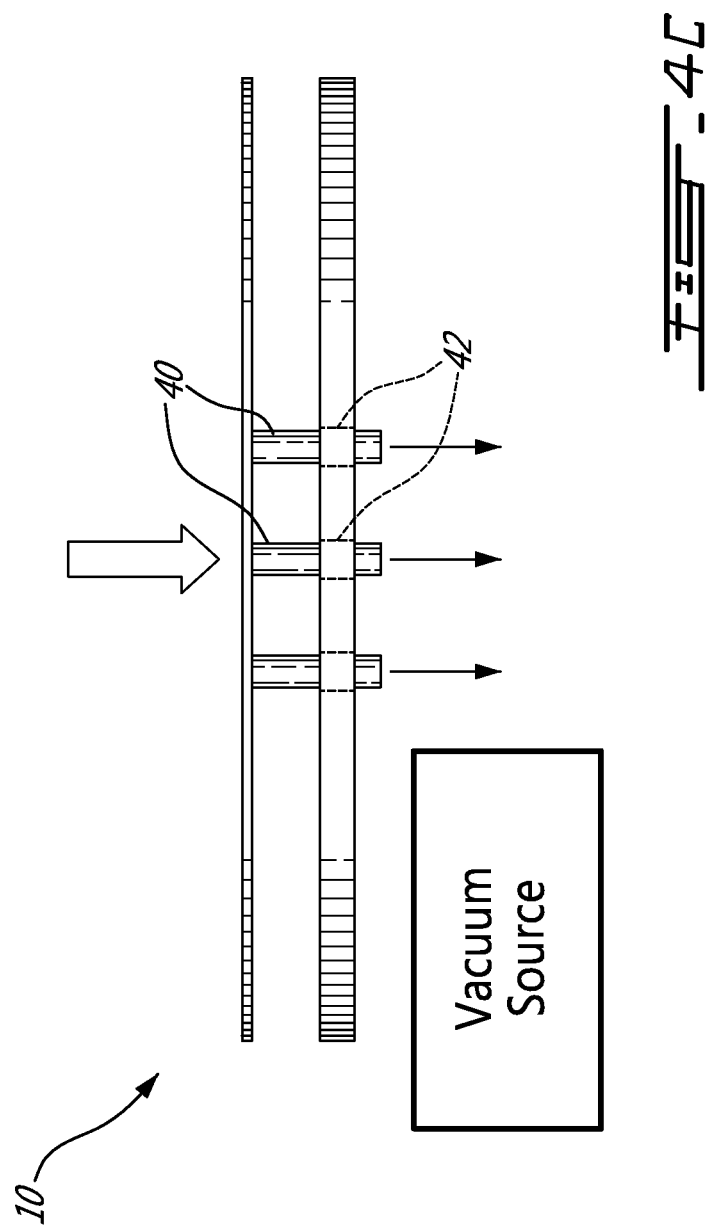

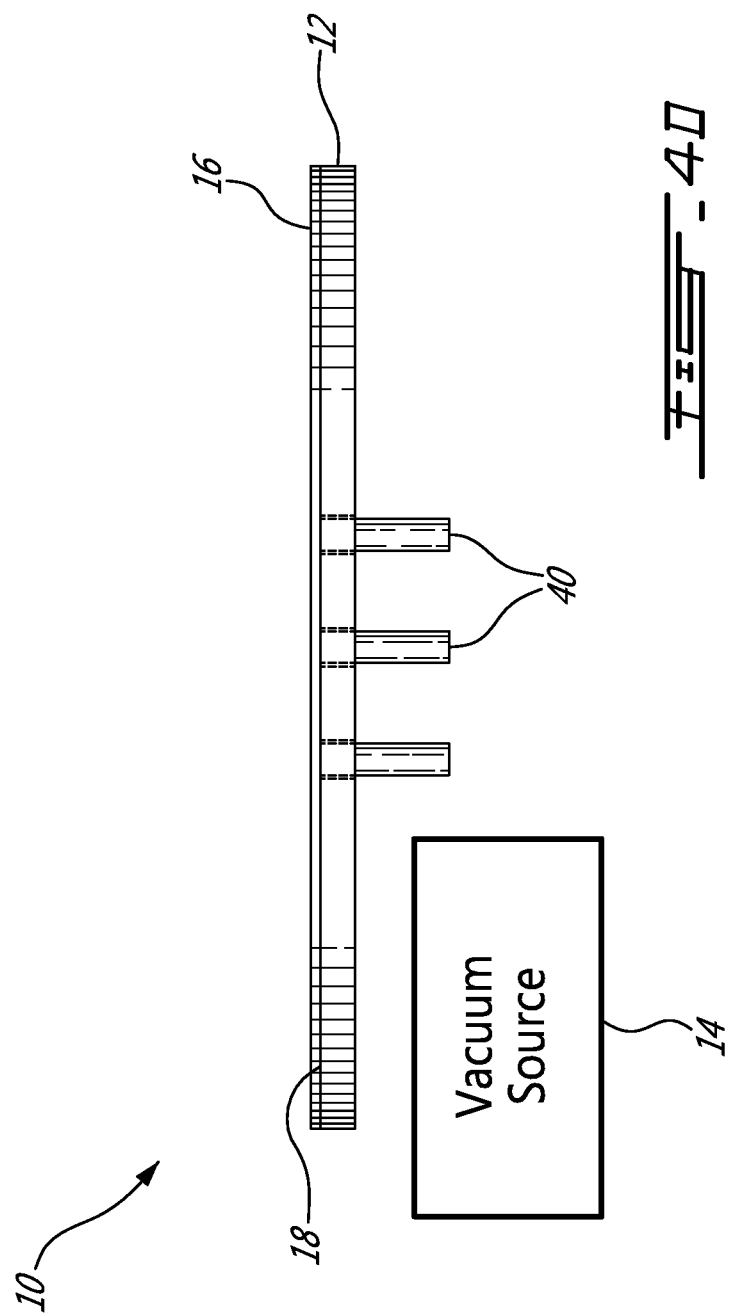

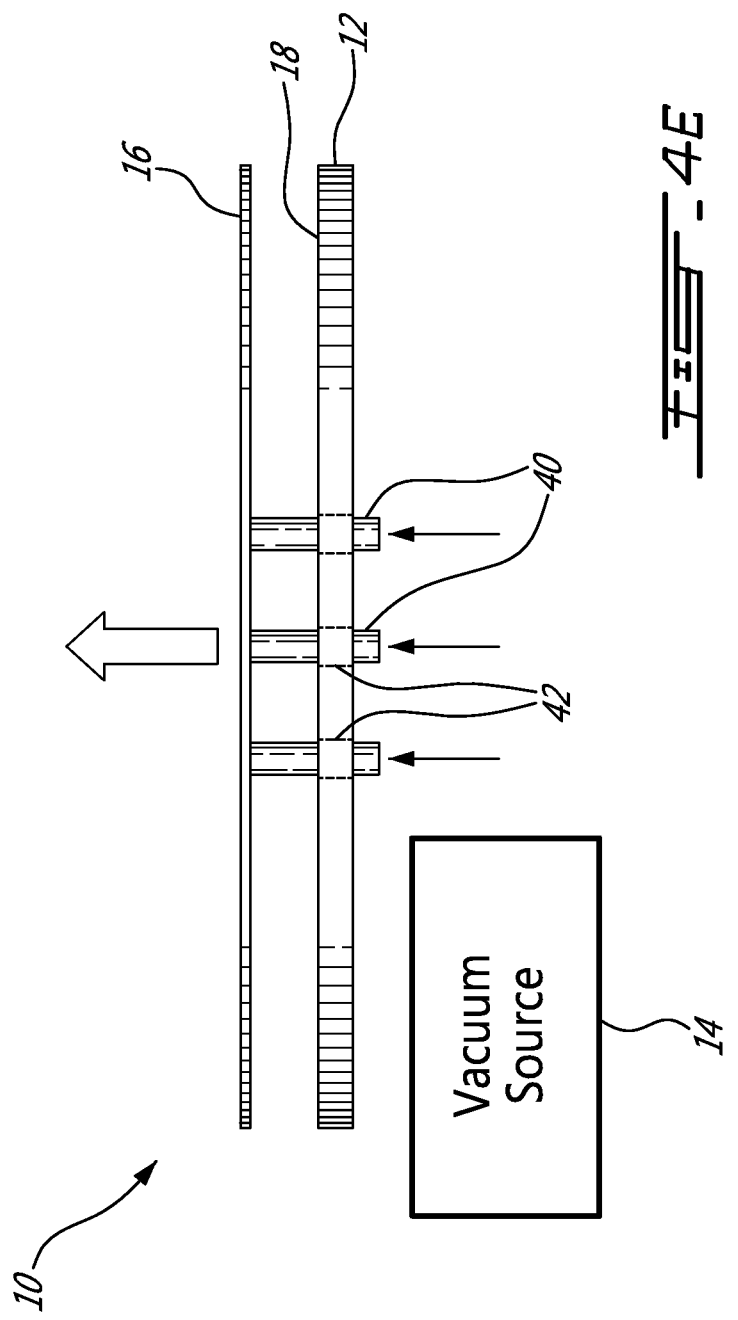

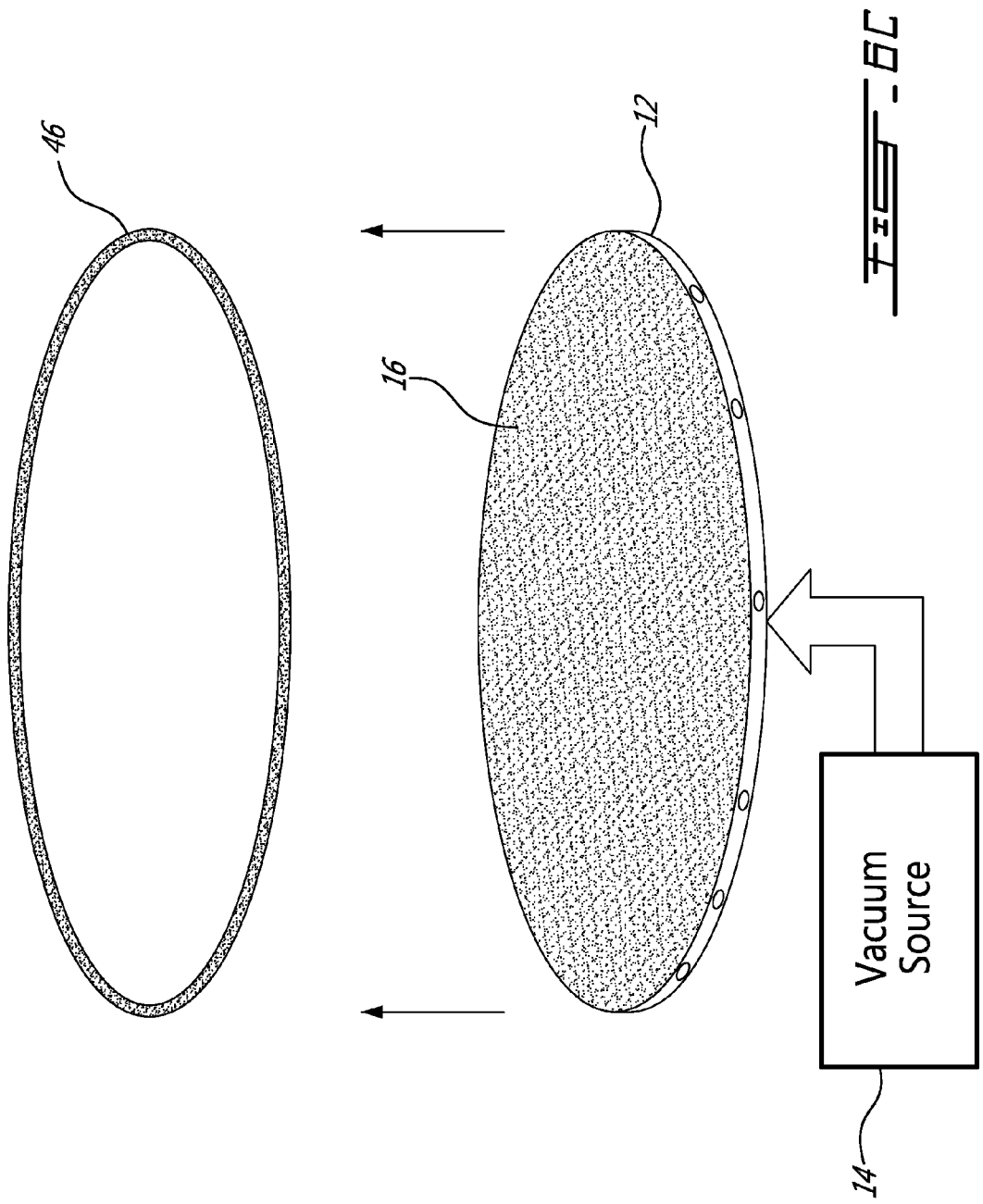

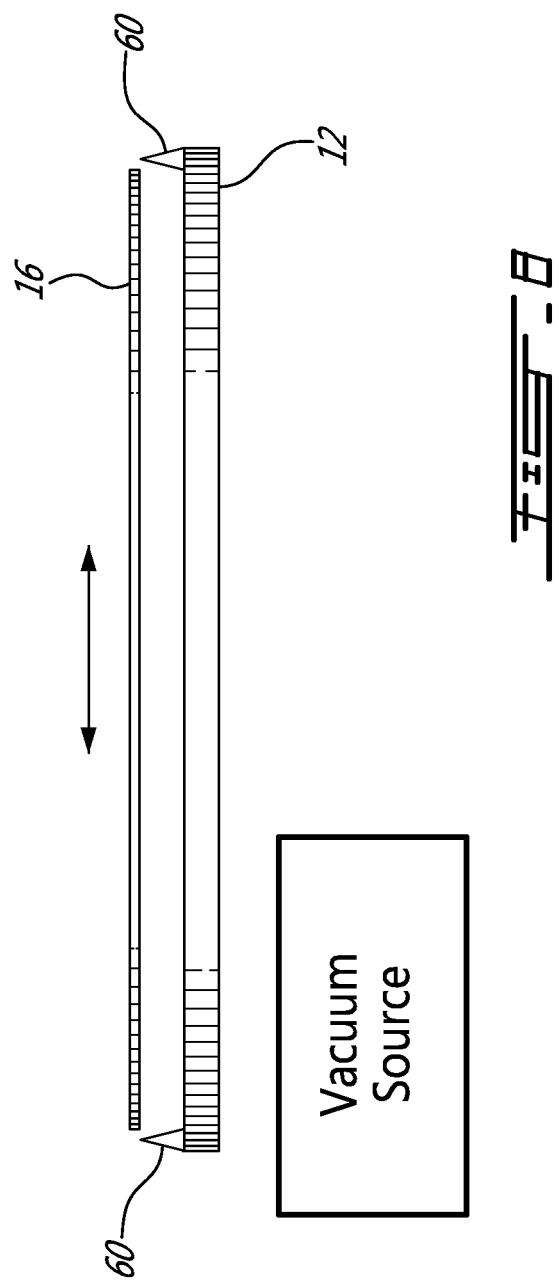

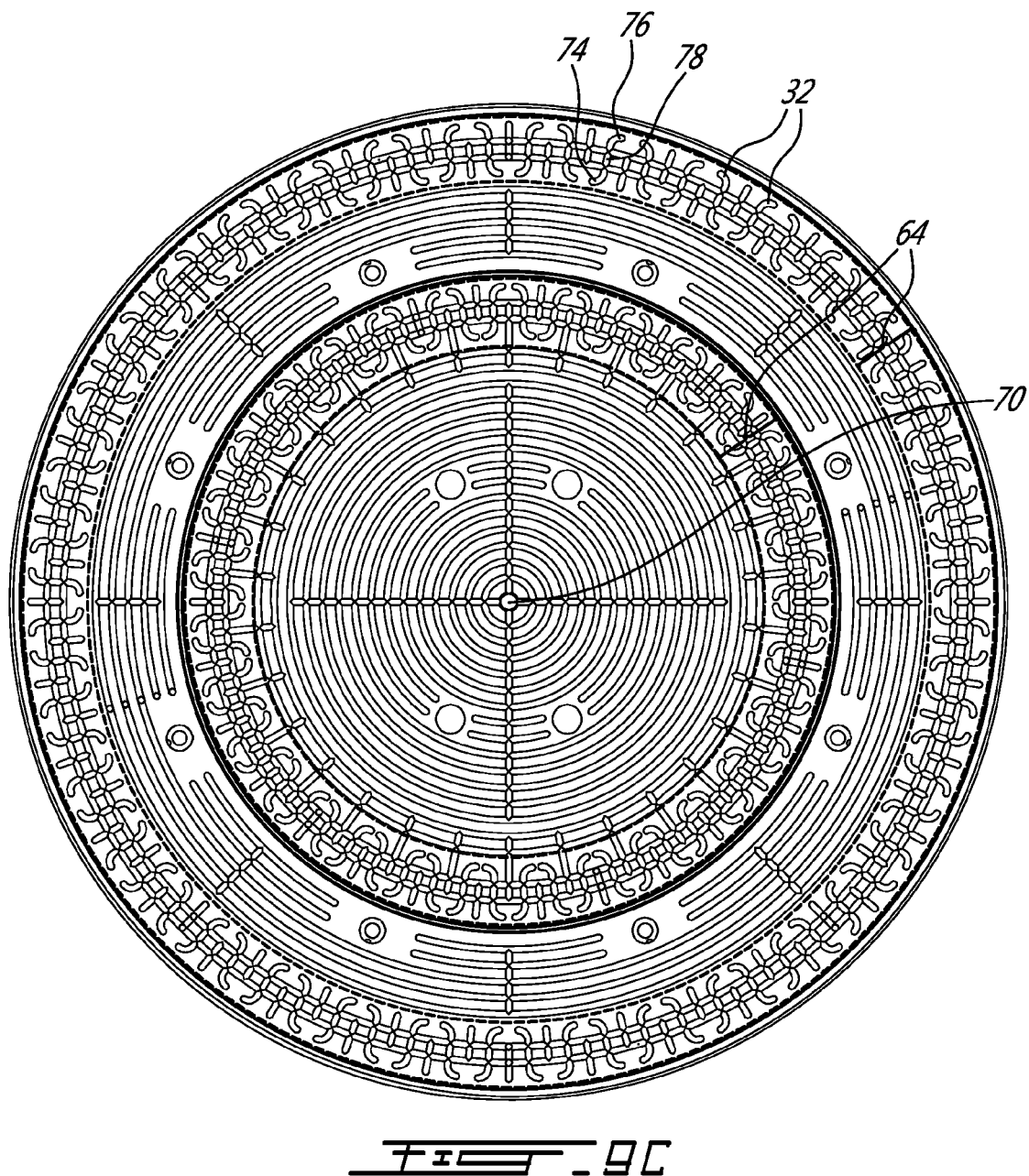

WAFER FLATTENING APPARATUS AND METHOD

CROSS REFERENCE TO RELATED APPLICATIONS

This application claims benefit of U.S. provisional application Ser. No. 61/320,001, filed on Apr. 1, 2010, which is incorporated herein in its entirety by reference.

FIELD OF THE INVENTION

The present invention relates to a wafer flattening apparatus and method. In particular, the present application relates to apparatus and methods using a vacuum for flattening wafers used in the fabrication of semiconductors and the like so they can be scanned for quality control purposes.

BACKGROUND OF THE INVENTION

In the semiconductor industry, in many applications silicon wafers and the like are held flat through advantageous use of vacuum chucks. As known in the art, such chucks are typically comprised of an aluminum block or the like into which a plurality of concentric 1-2 mm grooves have been machined. Each of the grooves is connected to a controllable source of vacuum pressure. Placing a silicon wafer on the chuck and applying a vacuum to the grooves introduces a suction force against the underside of the wafer thereby gripping it securely to the chuck. Alternatively, chucks manufactured from porous materials have been disclosed, however these currently are only suitable for very thin wafers which are not laminated.

One drawback of systems using such chucks is that the wafers are typically slightly warped during production and therefore do not make a good seal with the surface of the chuck. In many cases this prohibits the development of sufficient suction between the underside of the wafer in order to secure it to the chuck.

What is needed therefore, and an object of the present specification, is an apparatus for creating a seal such that sufficient suction can be developed to secure the wafer to the vacuum chuck.

One application which advantageously uses such vacuum chucks are 3D inspection devices which analyze the surface of the wafer for quality control purposes. In particular, wafers comprising semiconductors which are interconnected with Ball Grid Arrays (BGAs), 3D scanning is used to control the quality of the surface of the wafer and the solder balls or bumps or the like to ensure that their shape and placement falls within certain predefined specification ranges.

In this regard, another drawback therefore is that for very thin wafers, or wafers manufactured from easily pliable materials, the outer groove(s) of the concentric grooves of the vacuum chuck introduces a bending force on the wafer which is not held in chuck by a subsequent groove. As a result the outer edge of the wafer flexes upwards or downwards. In some applications, in particular those taking advantage of 3D scanning, this bending is of such significance that the 3D scanning is no longer able to be performed. In other cases, the bending force is so great that a suction force cannot be brought to bear on the wafer.

What is needed therefore, and also an object of the present specification, is a vacuum chuck which minimises the upward or downward bending of the outer edge of the wafer.

SUMMARY OF THE INVENTION

In order to address the above and other drawbacks, there is provided an apparatus for securing a substantially circular wafer comprising a chuck comprising a surface comprising at least one circular region of grooves having a region radius and arranged concentrically about a chuck centre, wherein an outer one of the at least one circular region of grooves comprises a plurality of tensioning grooves each comprising at least one arcuate bend having a bend radius substantially less than an outer region radius, and a vacuum source interconnected with each of the grooves. When the wafer is placed upon the surface concentric with the chuck centre and the vacuum source applied to the grooves, the wafer is held securely to the surface.

There is also provided a method for securing a wafer having an underside to a chuck having a chuck centre. The method comprises centring the wafer on the chuck centre, and applying a suction force between the underside of the wafer and the chuck wherein in a region having a region radius towards an outer extremity of the wafer, the suction force is applied along a line comprising an arcuate bend having a bend radius substantially less than the region radius.

Additionally, there is provided an apparatus for securing a substantially circular wafer having an upper surface and an outer perimeter. The apparatus comprises a chuck comprising a surface comprising a plurality of grooves and a chuck centre, a vacuum source interconnected with the grooves, and a collar comprising a rigid support and an o-ring, the o-ring having a diameter slightly smaller than the outer perimeter. When the wafer lowered onto the surface in a position concentric with the check centre, the collar placed against the upper surface concentric with the perimeter and the vacuum source is applied to the grooves, the wafer is held securely to the surface.

Other objects, advantages and features of the present invention will become more apparent upon reading of the following non-restrictive description of specific embodiments thereof, given by way of example only with reference to the accompanying drawings.

BRIEF DESCRIPTION OF THE DRAWINGS

FIG. 1 is a perspective/schematic diagram of a wafer scanning system comprising a wafer flattening apparatus in accordance with an illustrative embodiment of the present invention;

FIG. 2 is a top plan view of a wafer chuck in accordance with an illustrative embodiment of the present invention;

FIGS. 3A and 3B provide raised side perspective views of a wafer flattening apparatus in accordance with an illustrative embodiment of the present invention;

FIGS. 4A through 4E provide side plan views of a wafer flattening apparatus in accordance with an illustrative embodiment of the present invention;

FIGS. 6A through 6C provide raised side perspective views of a wafer flattening apparatus including a collar in accordance with an illustrative embodiment of the present invention;

FIG. 8 is a side plan view of a chuck and wafer comprising aligning cones in accordance with an illustrative embodiment of the present invention;

FIGS. 9B and 9C provide top plan views of the upper surface of a chuck respectively in accordance with first and second alternative illustrative embodiments of the present invention.

DETAILED DESCRIPTION OF THE ILLUSTRATIVE EMBODIMENTS

Figure 3B:
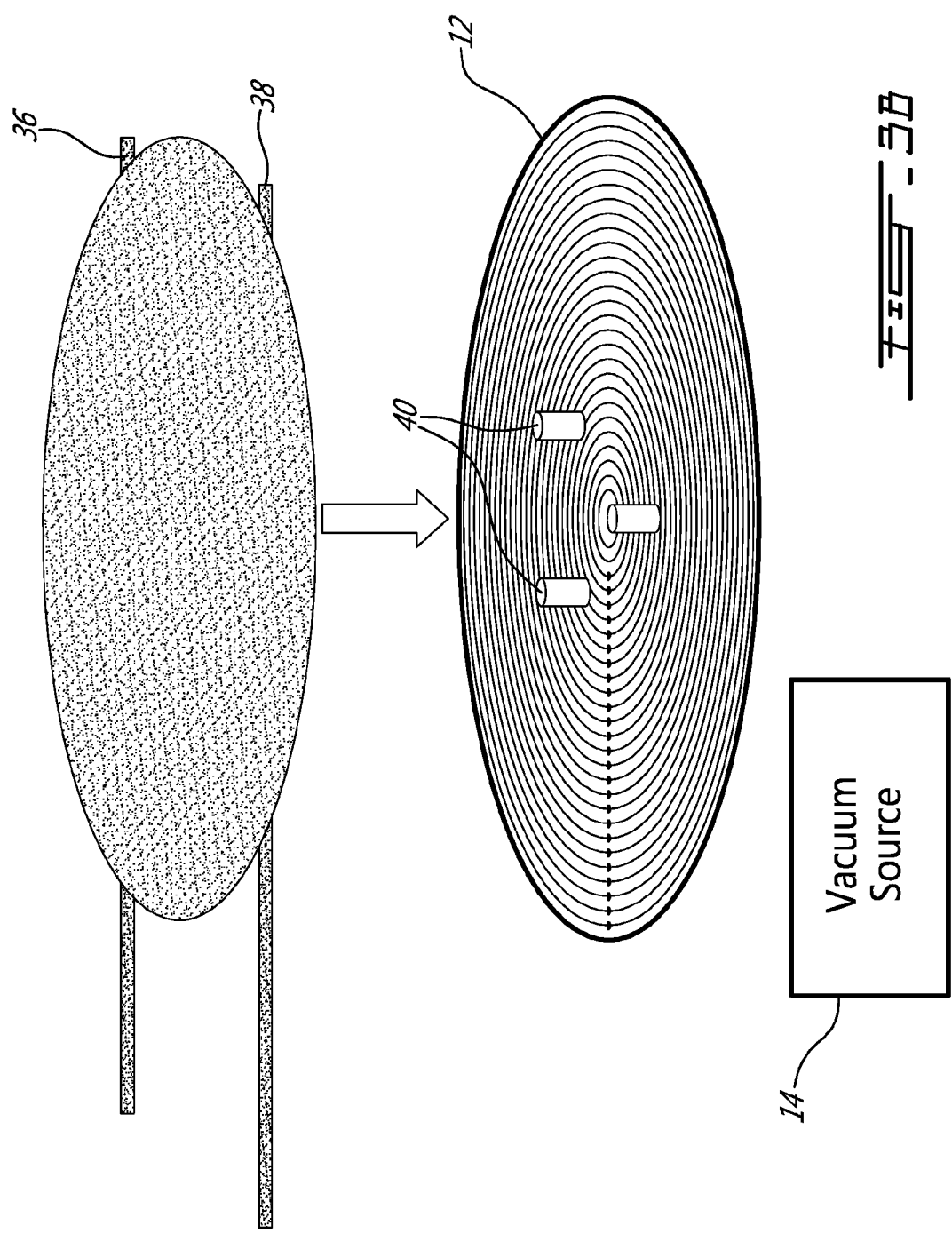

Referring now to FIG. 1, a wafer scanning system comprising a wafer flattening apparatus, generally referred to using the reference numeral 10, will now be described. The wafer flattening apparatus 10 comprises a chuck 12 and a vacuum source 14 which is used to provide an attractive suction force in order to retain a wafer 16 securely to an upper surface 18 of the chuck 14. In a particular Illustrative application, a laser scanner 20 emits a broad laser beam 22 targeted on a surface 24 of the wafer 16 which is moved across the surface 24 of the wafer 16 under control of a microprocessor 26. The reflected laser beam 28 is received by a camera 30, for example a CCD or CMOS array or the like.

Still referring to FIG. 1, the wafers 16 are typically of circular shape in that they are typically sliced from a cylindrical ingot of silicon or the like. Additionally, the wafers are typically of standardised diameters, for example 150 mm, 200 mm, 300 mm and the like but have thicknesses (illustratively between 150 µm and 300 µm) that vary depending on application and/or production methods.

Referring to FIG. 2, in order to receive the circular wafer (reference 16 in FIG. 1), the substantially flat surface 18 of the chuck 12, which is illustratively manufactured from a non-ferrous metal such as aluminium, is machined or otherwise formed to include a series of concentric circular grooves 32 of varying radii, illustratively having a spacing of about 6 mm and a width of about 2 mm. Alternatively, the chuck 12 could be manufactured from ceramics or composite materials or the like. The grooves 32 are in turn interconnected with the vacuum source 14 via a plurality of apertures 34 machined through the chuck 12. As discussed above, the vacuum source 14 is used to develop a suction force, via the grooves 32, to attract and hold in place the wafer. Once the chuck 12 has been appropriately machined, the surface 18 of the chuck 12 is typically plated with a plating metal, such as nickel or the like, or anodized.

Referring now to FIGS. 3A and 3B, in order to place the wafer 16 to be inspected on the chuck 12, illustratively a fork-like robotic arm comprising a pair of tines as in 36, 38 is provided which generally centre the wafer 16 above the chuck 12 and lower it onto a series of wafer receiving pegs 40 (generally 3 are required). As will be seen below, the wafer receiving pegs 40 allow the tines 36, 38 to be retracted once the wafer 16 has come to rest on the wafer receiving pegs 40 and subsequently allow the wafer 16 to be easily removed from the chuck 12 following scanning.

Referring now to FIGS. 4A through 4D, in a wafer receiving position, the wafer receiving pegs 40 are extended through bores 42 machined in the chuck 12 having a bore axis normal to the surface 18 of the chuck 12 such that they project above the surface 18 of the chuck 12 (FIG. 4A) at an equal height sufficient in order to allow the tines (references 36, 38 in FIGS. 3A and 3B) clear passage during extension and retraction between a wafer 16 resting on the pegs and the chuck surface 18 without disturbing the wafer 16. The wafer 16 is subsequently lowered by the tines until the wafer 16 comes to rest on the wafer receiving pegs 40 (FIG. 4B). The tines 36, 38 are then retracted and the wafer receiving pegs 40 withdrawn into their respective bores 42 (FIG. 4C) such that the wafer 16 comes to rest on the upper surface 18 of the chuck 12. At this point a suction force can be applied to the upper surface 18 of the chuck 12 using the vacuum source 14. Alternatively, the suction force can be applied prior to withdrawing the wafer receiving pegs 40 into their respective bores 42 in order limit the cushioning effects of air located between the wafer 16 and the surface 18 of the chuck 12 which might cause the wafer 16 to be inadvertently moved.

Referring now to FIG. 4E, subsequent to scanning, the wafer 16 can be raised above the surface 18 of the chuck by first relieving the suction force from the surface 18 of the chuck 12 and extending the wafer receiving pegs 40 in their respective apertures 42, at which point the tines 36, 38 can be inserted beneath the wafer 16, raised, and the wafer removed from the wafer flattening apparatus 10.

Figure 5A:
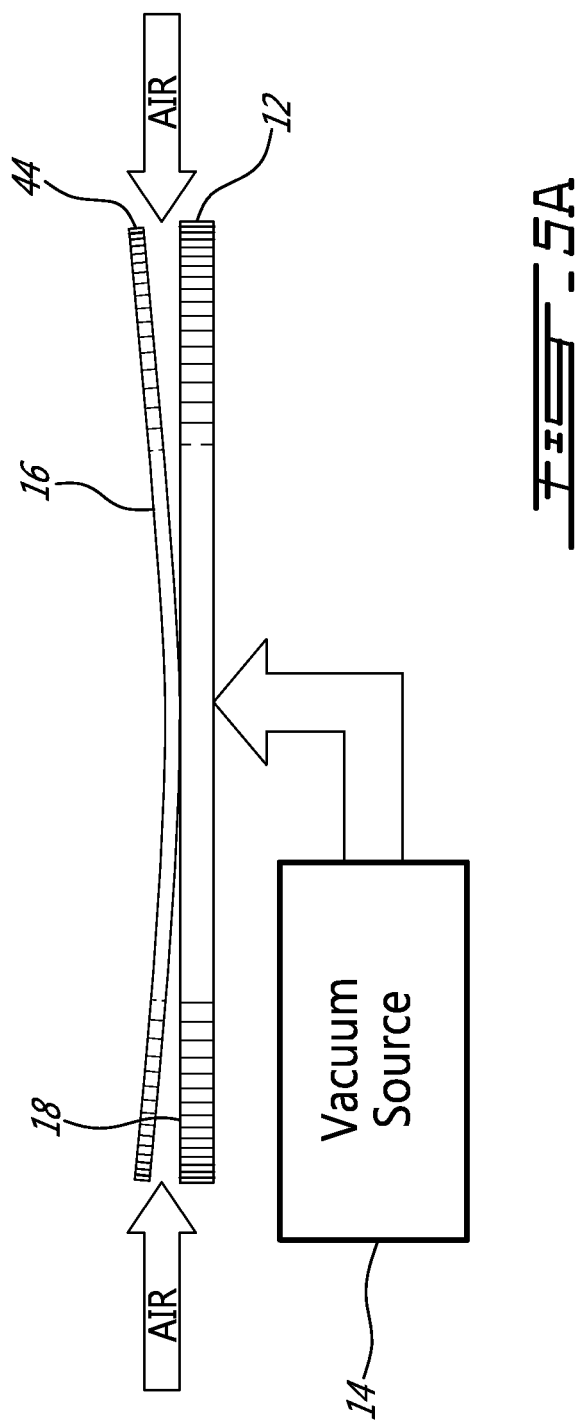
FIGS. 5A and 5B provide side plan views of a wafer flattening apparatus detailing wafer imperfections in accordance with an illustrative embodiment of the present invention.
Figure 5B:
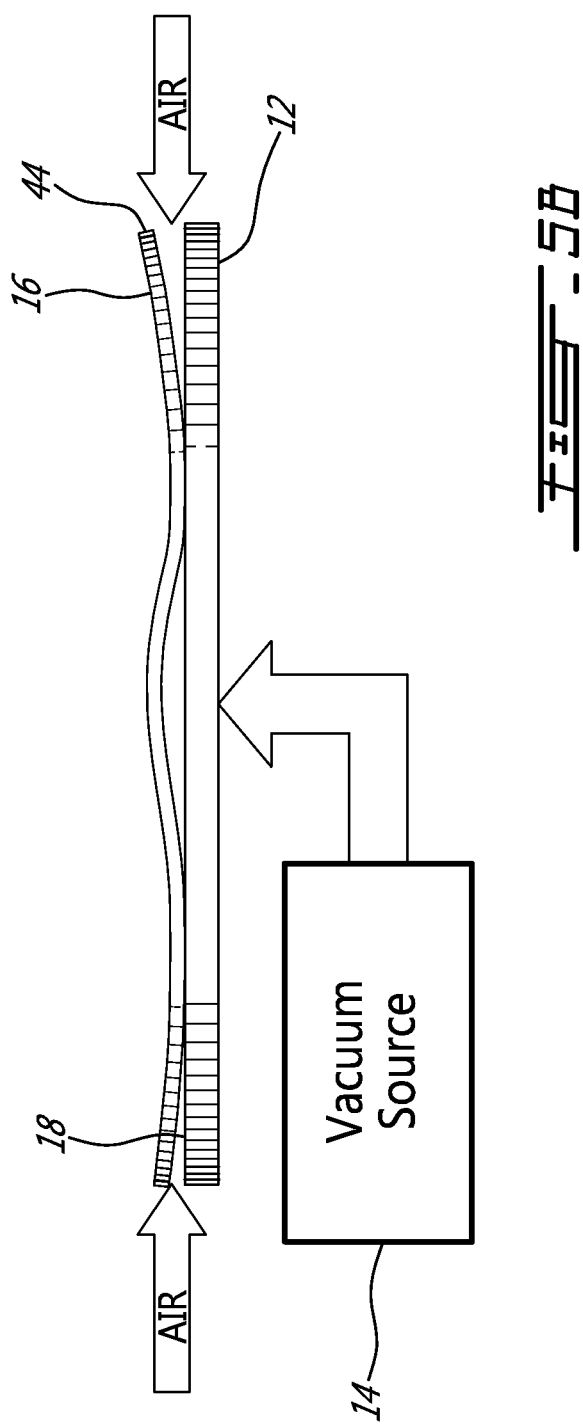

Referring now to FIGS. 5A and 5B, in practice the wafers 16 tend to be imperfect, not flat and build concave, convex (FIG. 5A) or complex surfaces (FIG. 5B). As a result, in many cases when suction force is applied to the upper surface 18 of the chuck 12, air is able to infiltrate underneath the perimeter 44 of the wafer 16. In many cases it is thus difficult to generate the suction force between the underside of the wafer 16 and the upper surface 18 of the chuck 12 necessary in order to adequately secure the wafer 16 to the chuck 12.

Figure 6A:
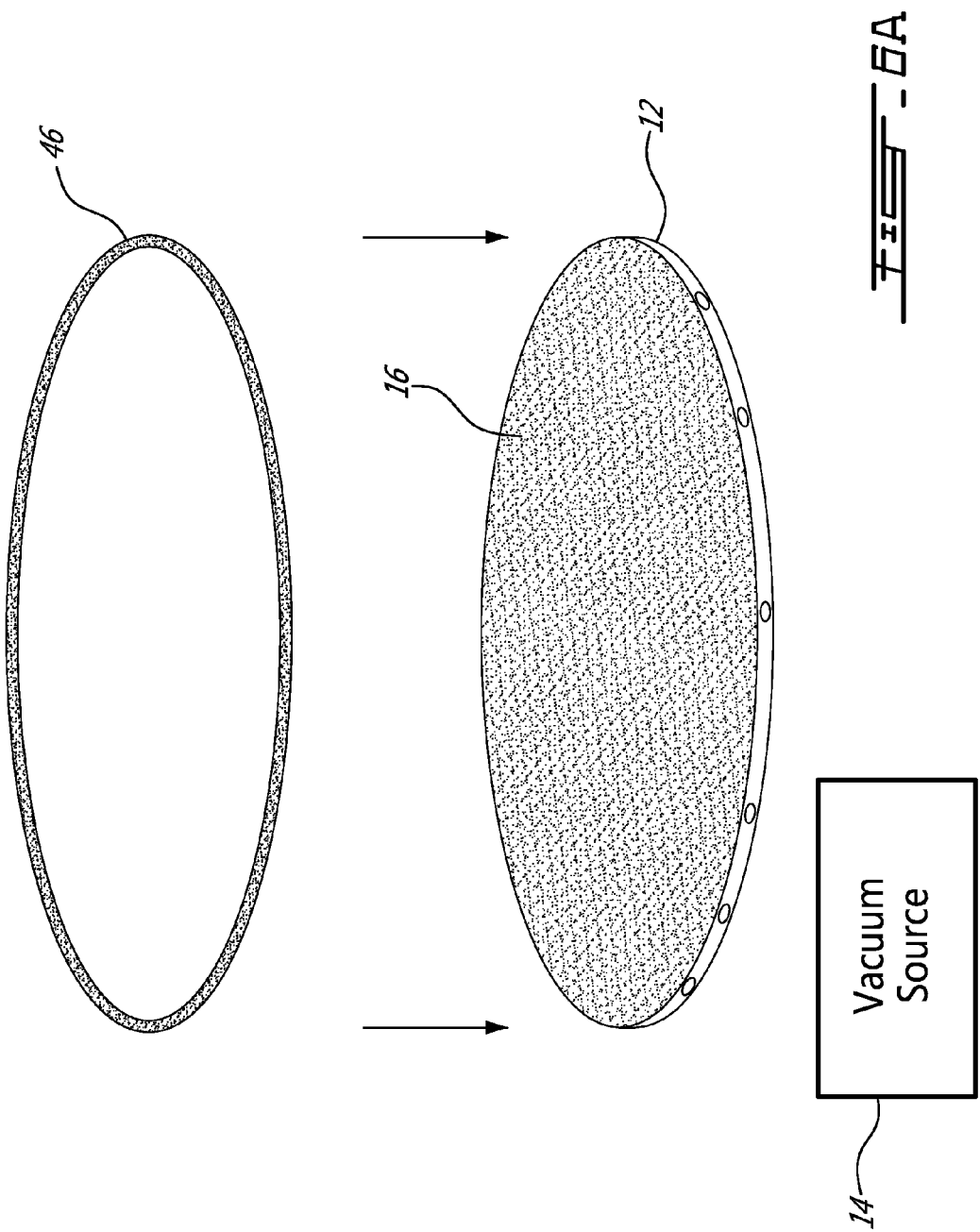
Figure 6B:
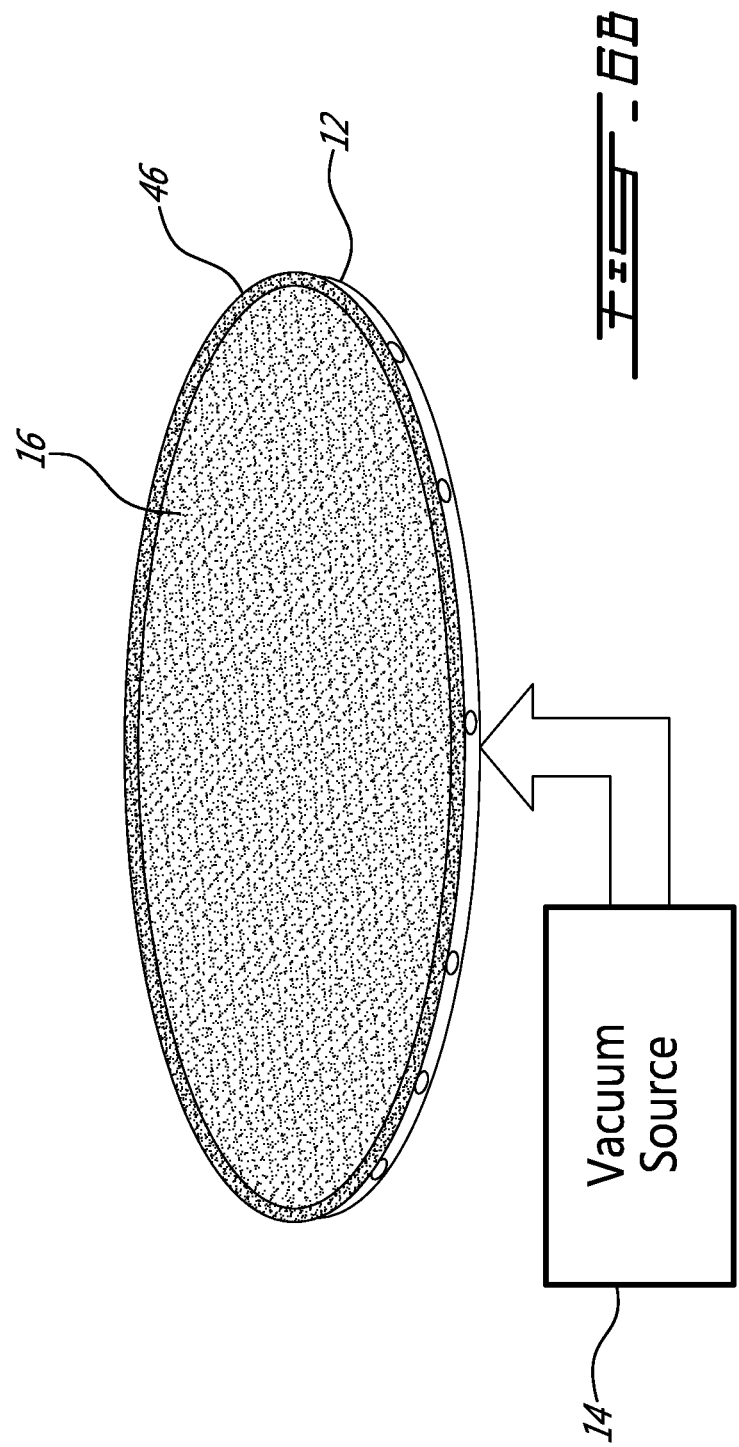

Referring now to FIGS. 6A through 6C, a collar 48 having diameter slightly less than that of the wafer is provided which is lowered over the perimeter 44 of the wafer 16 in order to improve the seal between the perimeter 44 and the surface 18 of the chuck 12 (FIG. 6A). Once the collar 48 is positioned over the perimeter 44 of the wafer 16 a light downward force applied and the suction force from the vacuum source applied to the upper surface 18 of the chuck 12 (FIG. 6B) thereby securing the wafer to the chuck 12. At this point the collar 48 can be removed (FIG. 6C), while maintaining the wafer securing suction force. In an alternative illustrative embodiment, the collar 48 can be reapplied subsequent to scanning and prior to removal of the suction force in order to ensure that the wafer 16 does not spring from the chuck 12 when the suction force is removed.

Figure 7:
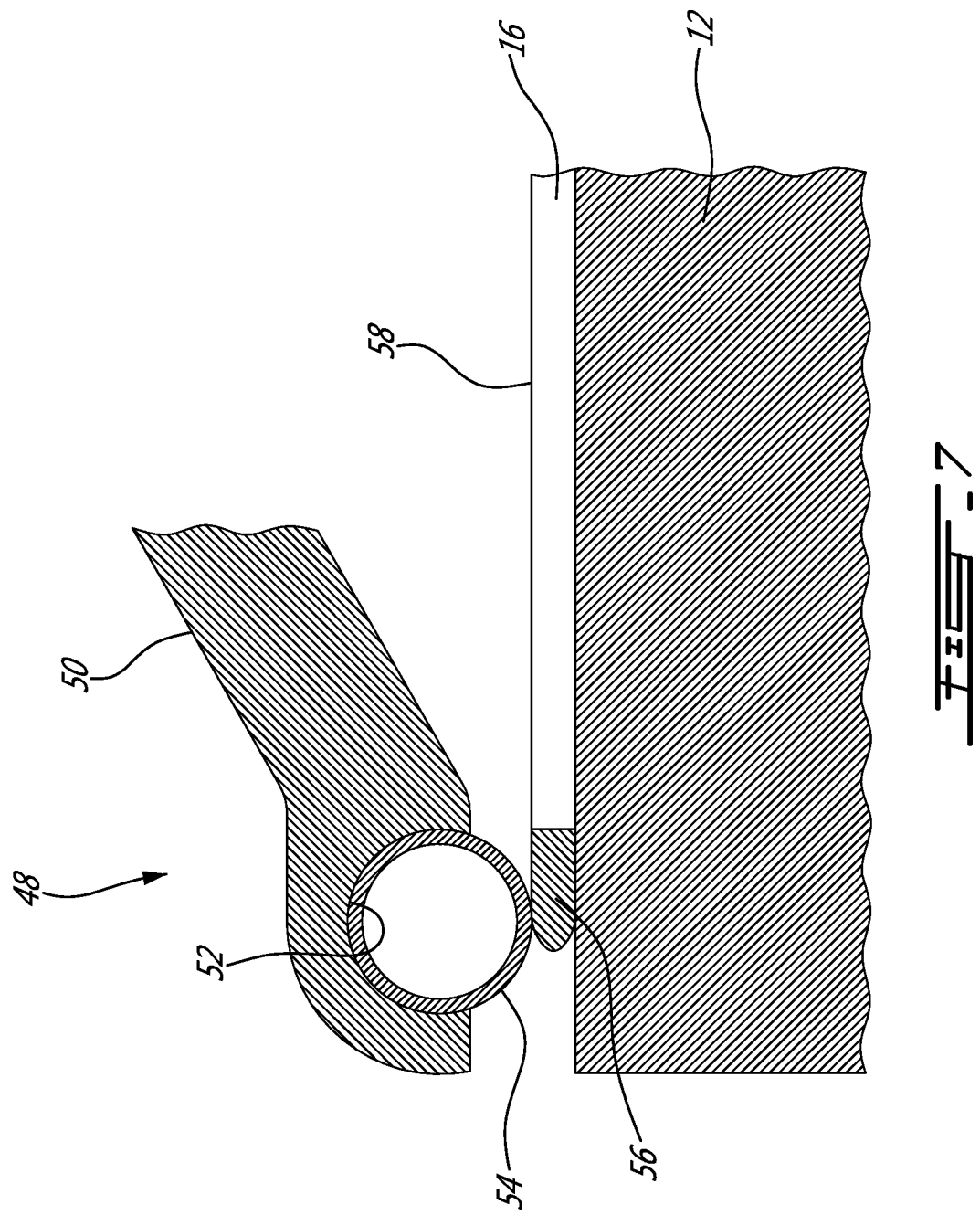
FIG. 7 is a side cross sectional view of a collar, wafer and chuck in accordance with an illustrative embodiment of the present invention.

Referring now to FIG. 7, the collar 48 is comprised of a rigid support 50 comprising a groove 52 into which is mounted a rubber O-ring 54. The diameter of the O-ring 54 is selected such that in operation, it rests on the unused periphery 56 of a concentrically placed wafer 16 secure to the chuck 12, thereby ensuring that components mounted on the upper surface 58 of the wafer 16 or electrical circuits are not damaged by the flattening operation. Typically the collar 48 would be positioned and removed using a robotic arm under control of a microprocessor or the like (both not shown). To ensure correct positioning of the collar 48, and accuracy of about ±0.5 mm would typically be required.

Referring now to FIG. 8, in a particular illustrative embodiment, a plurality of cone shaped protuberances 60 (typically three equally spaced around the perimeter of the wafer 16) can be provided in order to ensure that the wafer 16 sits concentric with the chuck 12. The protuberances 60 can be retractable (for example, in order to cope with wafers of varying diameters) or fixed.

Figure 9A:
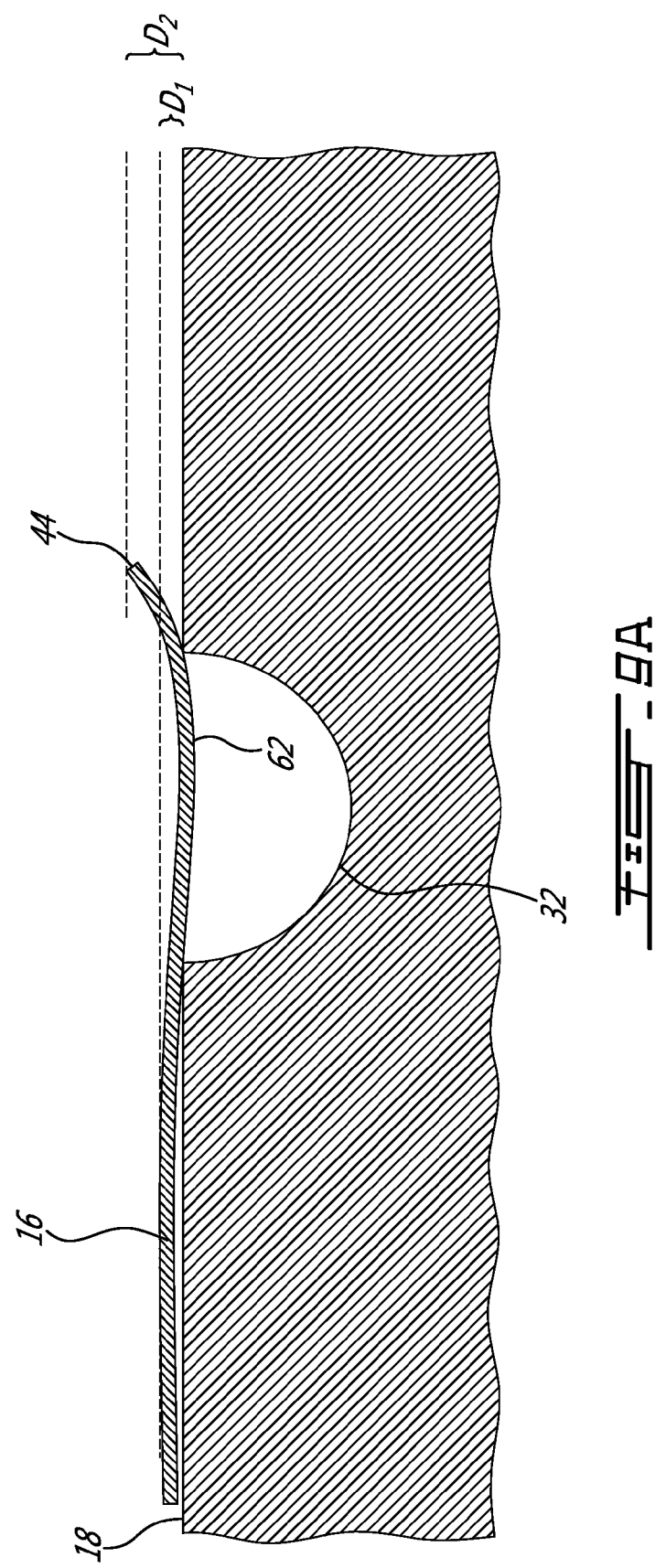
FIG. 9A is a side cross sectional view of a wafer and chuck detailing the bending effects introduced by suction on the wafer.

Referring now to FIG. 9A, as discussed above the suction force is directed between the upper surface 18 of the chuck 12 and the wafer 16 via a series of grooves 32 machined or otherwise formed in the upper surface 18 of the chuck 12. In particular with wafers 16 manufactured from relatively thin or pliable materials, the suction force tends to draw a small portion of the wafer 16 into the groove 32 giving rise to a local bend 62 in the wafer 16 which in turn causes the wafer to bend away from the upper surface 18 of the chuck 12. For concentric grooves 32 located towards the centre of the chuck 12 this generally does not give rise to any problems as the spacing between subsequent grooves 32 is chosen small enough to correct this trend and ensure that the distance $D_1$ of the wafer 16 to the upper surface 18 of the chuck 12 is maintained within acceptable limits. However, in the case of the most outer concentric groove 32, the bend goes unchecked, which can give rise to an unwanted rising of the perimeter 44 of the wafer 16 to an unacceptable distance $D_2$. This is particularly the case in 3D scanning or high resolution 2D scanning where the tolerance to undulations in the surface of the wafer 16 is limited, leading to imperfect scanning results. Additionally, in some cases the bending force introduced by one or more of the more inner grooves 32 is so great that the chuck 12 is unable to generate sufficient force to secure the perimeter 44 of the wafer 16 to the most outer grooves 32.

Figure 9B:
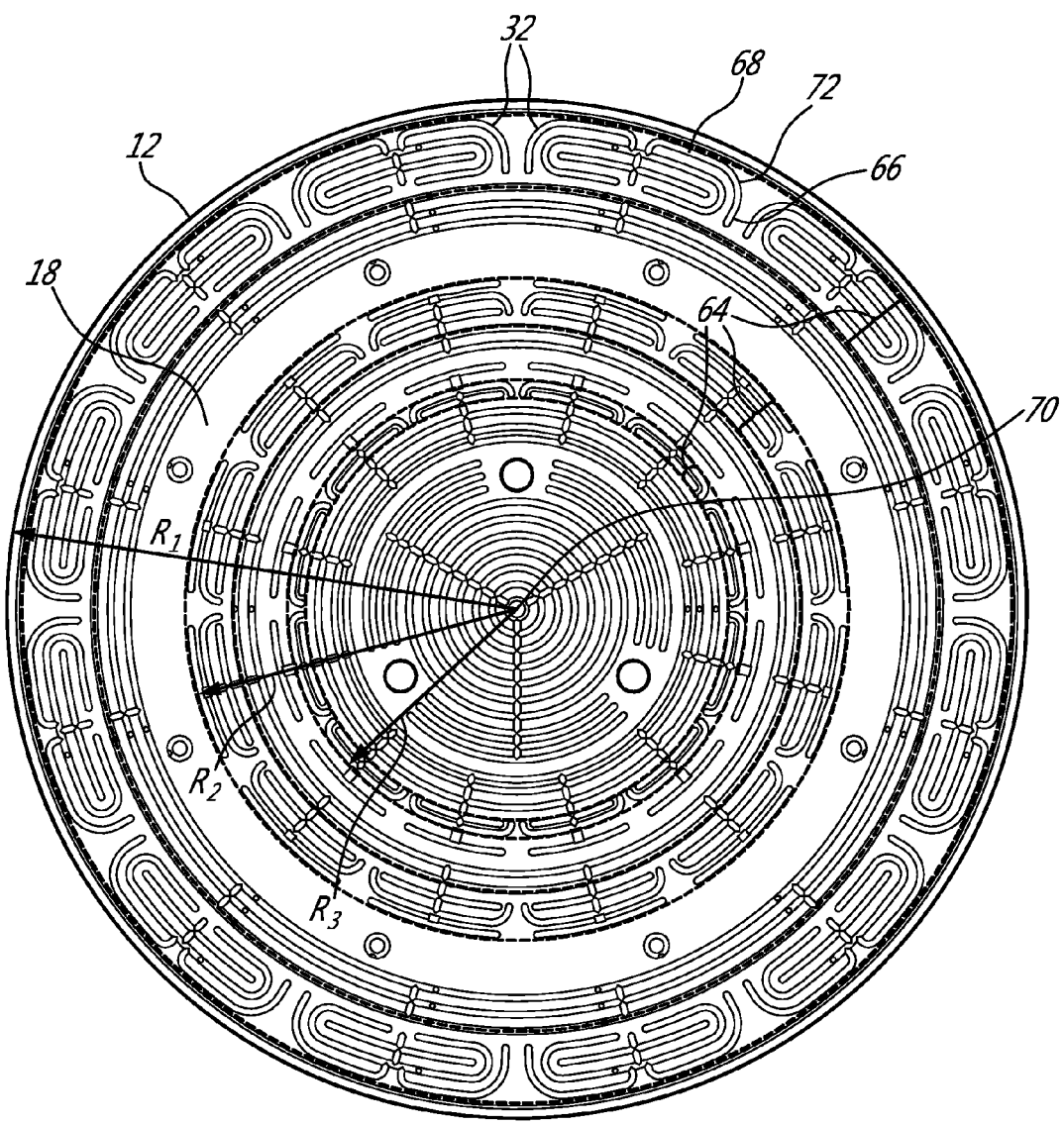

Referring now to FIG. 9B, in order to counter the above effect and in accordance with a first alternative illustrative embodiment of the present invention, the upper surface 18 of the chuck 12 is machined such that the series of groove(s) 32 in a region as in 64 of the chuck 12 which coincides with an outer edge of the wafer to be secured comprise a radial portion 66 and tangential portion 68 when referenced to a chuck centre 70, and arcuate interconnecting portions 72 comprising an arcuate bend (illustratively shown having a constant radius of curvature) in order to introduce tensioning forces to the perimeter of the wafer. The introduction of a groove as in 32 having an arcuate bend component in a region as in 64 of the chuck 12 towards the perimeter of the wafer introduces tensioning forces which counter the effects of the tangential components, thereby ensuring that the deflection introduced into the perimeter of the wafer is controlled. Selection of the groove(s) 32 to include both tangential 68, radial 66 and arcuate 72 components depends in part on the flexibility of the wafer being secured to the chuck 12 as well as the pressure necessary in order to hold the wafer securely to the chuck 12. Illustratively, a series of such grooves as in 32 are provided which are evenly spaced about the chuck centre 70. Additionally, the radius of the arcuate component 72 is many times smaller than the radius of the region 64.

Referring to FIG. 9C, in accordance with a second alternative illustrative embodiment of the present invention, the grooves as in 32 are in a region as in 64 of the chuck 12 which coincides with an outer edge of the wafer to be secured and are generally S-shaped, with at least a portion of the grooves as in 32 comprising a pair of arcuate bend portions 74, 76 interconnected by a straight portion 78 arranged radially to the chuck centre 70.

Still referring to FIGS. 9B and 9C, typically more than one region as in 64 of the upper surface 18 of the chuck 12 will be machined to include grooves 32 comprising both tangential and radial components in order to accommodate, for example, wafers having different wafer radii $R_1$, $R_2$ and $R_3$ as indicated on FIG. 9B.

Although the present invention has been described hereinabove by way of specific embodiments thereof, it can be modified, without departing from the spirit and nature of the subject invention as defined in the appended claims.

What is claimed is:

1. An apparatus for securing a substantially circular wafer having a wafer radius comprising:
    a chuck comprising a surface comprising at least one circular region of grooves having a region radius and arranged concentrically about a chuck centre, wherein an outer one of said at least one circular region of grooves comprises a plurality of tensioning grooves each comprising at least one arcuate bend having a bend radius substantially less than said region radius and wherein said region radius is less than said wafer radius; and
    a vacuum source interconnected with each of said grooves; wherein when the wafer is placed upon said surface concentric with said chuck centre and said vacuum source applied to said grooves, said wafer is held securely to said surface.

2. The apparatus of claim 1, wherein said at least one tensioning groove further comprises a radial groove part arranged radially to said chuck centre, said arcuate bend at an end of said radial groove part.

3. The apparatus of claim 2, wherein said at least one tensioning groove further comprises a second arcuate bend at a second end of said radial groove part.

4. The apparatus of claim 1, wherein at least one tensioning groove further comprises a first tangential groove part arranged along a portion of a circle concentric with said chuck centre, said arcuate bend at an end of said tangential groove part.

5. The apparatus of claim 4, wherein said at least one tensioning groove further comprises a second tangential groove part arranged in parallel to and displaced from said first tangential groove part, and wherein said arcuate bend turns through 180 degrees and interconnects said end of said first tangential groove part with an end of said second tangential groove part.

6. The apparatus of claim 1, wherein said at least one tensioning groove further comprises a radial groove part arranged radially to said chuck centre and a tangential groove part arranged along a portion of a circle concentric with said chuck centre, said arcuate bend interconnecting said radial groove part and said tangential groove part.

7. The apparatus of claim 1, wherein said arcuate bend has a constant radius.

8. The apparatus of claim 1, wherein each of said plurality of tensioning grooves comprises a first tangential groove part and a pair of radial groove parts, each one of said pair of radial groove parts connected to a respective end of said first tangential groove part by a respective one of a pair of said arcuate bends.

9. The apparatus of claim 8, wherein each of said at least one tensioning groove is symmetrical about an axis arranged radially to said chuck centre.

10. The apparatus of claim 1, wherein said plurality of tensioning grooves are spaced evenly about said chuck centre.

11. The apparatus of claim 1, further comprising at least one inner region comprising at least one groove arranged as a ring concentric with said chuck centre.

12. The apparatus of claim 1, further comprising at least one inner region comprising a plurality of said tensioning grooves spaced evenly about said chuck centre.

13. The apparatus of claim 12, wherein said inner region comprises a most outer groove arranged along at least a portion of a circle concentric with said chuck centre.

14. An apparatus for securing a substantially circular wafer having an upper surface and an outer perimeter, the apparatus comprising:
    a chuck comprising a surface comprising a plurality of grooves and a chuck centre;
    a vacuum source interconnected with said grooves; and
    a collar comprising a rigid support and an o-ring, said o-ring having a diameter slightly smaller than the outer perimeter;
wherein when the wafer lowered onto said surface in a position concentric with said check centre, said collar placed against the upper surface concentric with the outer perimeter and said vacuum source is applied to said grooves, said wafer is held securely to said surface.

15. The apparatus of claim 14, wherein each of said grooves is circular and concentric with said chuck centre.

16. The apparatus of claim 14, wherein said chuck further comprises at least three bores each having a bore axis normal to said chuck surface and wherein one of at least three pegs is positioned within each of said bores, said pegs being moveable between an extended positioned, wherein an end each of said pegs is extended at a height above the chuck surface and a retracted position, wherein each of said pegs is withdrawn into their respective bores.

17. The apparatus of claim 16, further comprising a robot arm comprising a pair of tines for placing the wafer on said pegs wherein said height is sufficient in order to allow said tines to be retracted from between the wafer and said chuck surface when said pegs are in said extended position.

18. The apparatus of claim 14, wherein a surface of said o-ring is rubber-like.

19. The apparatus of claim 14, wherein said chuck further comprises at least three cone shaped protuberances protruding from said surface and spaced evenly along a circular path concentric with said chuck centre, said circular path having a path radius slightly larger than said outer perimeter.

* * * * *